United States Patent
Hori et al.

(10) Patent No.: US 12,395,146 B2
(45) Date of Patent: Aug. 19, 2025

(54) COMPOSITE SUBSTRATE FOR ACOUSTIC WAVE DEVICE

(71) Applicant: NGK INSULATORS, LTD., Nagoya (JP)

(72) Inventors: Yuji Hori, Owariasahi (JP); Takahiro Yamadera, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 839 days.

(21) Appl. No.: 17/686,804

(22) Filed: Mar. 4, 2022

(65) Prior Publication Data
US 2022/0190804 A1  Jun. 16, 2022

Related U.S. Application Data

(63) Continuation of application No. PCT/JP2021/023918, filed on Jun. 24, 2021.

(30) Foreign Application Priority Data

Sep. 10, 2020 (JP) ................. 2020-152198

(51) Int. Cl.
*H03H 9/02* (2006.01)
*H03H 9/25* (2006.01)

(52) U.S. Cl.
CPC .... *H03H 9/02574* (2013.01); *H03H 9/02559* (2013.01); *H03H 9/02866* (2013.01); *H03H 9/25* (2013.01)

(58) Field of Classification Search
CPC .......... H03H 9/02574; H03H 9/02559; H03H 9/02866
(Continued)

(56) References Cited

U.S. PATENT DOCUMENTS

| 2017/0063333 A1 | 3/2017 | Gilbert et al. |
| 2019/0036009 A1 | 1/2019 | Tai et al. |

(Continued)

FOREIGN PATENT DOCUMENTS

| JP | 563500 A | 3/1993 |
| JP | 200153579 A | 2/2001 |

(Continued)

OTHER PUBLICATIONS

English Translation of the International Preliminary Report on Patentability, issued in corresponding International Application No. PCT/JP2021/023918, Date of Mailing Mar. 23, 2023 (6 pages).

(Continued)

*Primary Examiner* — Derek J Rosenau
(74) *Attorney, Agent, or Firm* — FLYNN THIEL, P.C.

(57) ABSTRACT

A composite substrate for an acoustic wave device includes a piezoelectric material layer, supporting substrate and x layers (x represents an integer of 3 or larger) of intermediate layers between the piezoelectric material layer and supporting substrate. The piezoelectric material layer, supporting substrate and intermediate layers satisfy a formula (1) ($R_n < R_{n+1}$), the formula (2) ($V_{n-1} < V_n$) is satisfied when x is an even number. A formula (3) ($V_{n-1} > V_n$) is satisfied when x is an odd number.

3 Claims, 7 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2019/0036509 A1 | 1/2019 | Tai et al. |
| 2019/0288661 A1 | 9/2019 | Akiyama et al. |
| 2019/0372547 A1* | 12/2019 | Kishimoto ............... H03H 3/02 |

FOREIGN PATENT DOCUMENTS

| | | |
|---|---|---|
| JP | 201486400 A | 5/2014 |
| JP | 6250856 B1 | 12/2017 |
| JP | 201861226 A | 4/2018 |
| WO | 2017163729 A1 | 9/2017 |
| WO | 2018154950 A1 | 8/2018 |
| WO | 2020130128 A1 | 6/2020 |

OTHER PUBLICATIONS

European Search Report issued in corresponding European Application No. 21866333.4, dated Jan. 26, 2023 (7 pages).
International Search Report issued in corresponding International Application No. PCT/JP2021/023918 date of mailing Aug. 31, 2021 (3 pages).
Written Opinion of International Searching Authority issued in corresponding International Application No. PCT/JP2021/023918 dated Aug. 31, 2021 (4 pages).

* cited by examiner

Distance from surface of supporting substrate

Distance from surface of supporting substrate

COMPOSITE SUBSTRATE FOR ACOUSTIC WAVE DEVICE

CROSS-REFERENCE TO RELATED APPLICATIONS

This is a continuation of PCT/JP2021/023918, filed Jun. 24, 2021, which claims priority to Japanese Application No. JP2020-152198 filed on Sep. 10, 2020, the entire contents of which are hereby incorporated by reference.

TECHNICAL FIELD

The present invention is related to a composite substrate for an acoustic wave device.

BACKGROUND ARTS

According to a surface acoustic wave filter produced by adhering lithium tantalate and sapphire through a silicon oxide layer, it is known that bulk wave is generated at the bonding interface to result in unnecessary response in transmission band and high frequency band. It is proposed the technique of suppressing the unnecessary response for preventing it by introducing a roughened surface at the bonding interface and by scattering the bulk wave (Patent document 1, Patent document 2).

According to patent document 1, as the bonding surface is roughened, the geometrical specification of the roughened surface is adjusted so that the ratio of the average length RSm of components in a cross-sectional curve of roughness structure forming the roughened surface and of the wavelength λ of surface acoustic wave is made 0.2 or larger and 7.0 or smaller and the arithmetic average roughness Ra of the cross-sectional curve of the roughness structure is made 100 nm or larger. Further, according to patent document 2, it is defined the difference in height of the roughened surface.

PATENT DOCUMENTS (Patent document 1) Japanese Patent No. 6250856B
(Patent document 2) U.S. Patent Publication No. 2017-063333A

SUMMARY OF THE INVENTION

However, it is necessary the process of considerably roughening the back surface of the piezoelectric material substrate for obtaining sufficiently high effect of suppressing spurious. However, as the bonded body is produced by applying the piezoelectric material substrate after the back surface is subjected to such processing, the thinning of the piezoelectric material provides a processing denatured layer on the surface so that the characteristics tends to be deteriorated. Further, when the piezoelectric material substrate is bonded to the supporting substrate through an intermediate layer, it is difficult to obtain a high bonding strength in the case that the roughness of the back surface of the piezoelectric material substrate is large.

An object of the present invention is, in a composite substrate for an acoustic wave device composed of a bonded body of a piezoelectric material substrate and supporting substrate, to improve the bonding strength of the piezoelectric material substrate and supporting substrate and to effectively reduce the reflection of a bulk wave so that spurious is suppressed.

The present invention provides a composite substrate for an acoustic wave device, said composite substrate comprising:
  a piezoelectric material layer;
  a supporting substrate; and
  x layers (x represents an integer of 3 or larger) of intermediate layers between said piezoelectric material layer and said supporting substrate,
  wherein said piezoelectric material layer, said supporting substrate and said intermediate layers satisfy the following formula (1),
  wherein the following formula (2) is satisfied when x is an even number, and;
  wherein the following formula (3) is satisfied when x is an odd number.

$$R_n < R_{n+1} \tag{1}$$

(In the formula (1),
  n represents all of integers of 1 to x,
  $R_n$ represents an arithmetic average roughness of a surface, on the side of said piezoelectric material layer, of an n'th-order intermediate layer from said piezoelectric material layer,
  $R_{x+1}$ represents an arithmetic average roughness of a surface of said supporting substrate on the side of said piezoelectric material layer.)

$$V_{n-1} < V_n \tag{2}$$

(In the formula (2),
  n represents all of even numbers of 2 or larger and x or smaller, and
  $V_n$ represents an acoustic velocity of said n'th-order intermediate layer from said piezoelectric material layer.)

$$V_{n-1} > V_n \tag{3}$$

(In the formula (3),
  n represents all of odd numbers of 1 or larger and x or smaller,
  $V_n$ represents an acoustic velocity of said n'th-order intermediate layer from said piezoelectric material layer, and
  $V_0$ represents an acoustic velocity of said piezoelectric material layer.)

According to the present invention, in a composite substrate for an acoustic wave device composed of a bonded body of a piezoelectric material substrate and supporting substrate, the bonding strength of the piezoelectric material substrate is improved, by lowering the arithmetic average roughnesses of the intermediate layers stepwise from the supporting substrate to the piezoelectric material substrate. At the same time, as the intermediate layer having a higher acoustic velocity and intermediate layer having a lower acoustic velocity are provided sequentially adjacent to each other from the piezoelectric material substrate to the supporting substrate, it is found that the reflection of bulk wave can be effectively reduced and the spurious wave is considerably suppressed. The invention is thus made.

BRIEF DESCRIPTIONS OF THE DRAWINGS

FIG. 1(a) is a cross sectional view schematically showing the state that intermediate layers X, 2 and bonding layer M are provided on a supporting substrate, FIG. 1(b) is a cross sectional view showing the state that a bonding layer Y is provided on a piezoelectric material substrate, and FIG. 1(c)

is a cross sectional view showing a bonded body 7A of the supporting body and piezoelectric material substrate.

FIG. 2(a) is a cross sectional view schematically showing the state that intermediate layers X, 3 and 2 and bonding layer M are provided on the supporting substrate, FIG. 2(b) is a cross sectional view showing the state that a bonding layer Y is provided on the piezoelectric material substrate, and FIG. 2(c) is a cross sectional view showing a bonded body 7B of the supporting substrate and piezoelectric material substrate.

MODES FOR CARRYING OUT THE INVENTION

Figure 1A:
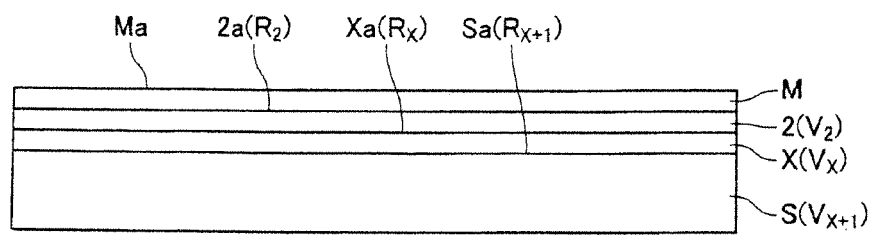

The present invention will be described further in detail, appropriately referring to the drawings.

First, as shown in FIG. 1(a), intermediate layers X and 2 and a bonding layer M are sequentially formed on a surface Sa of a supporting substrate S. Then, the surface Ma of the bonding layer M is subjected to precise polishing process, for example, to chemical mechanical polishing. The surface Ma of the bonding layer M is then subjected to surface activation.

Figure 1B:
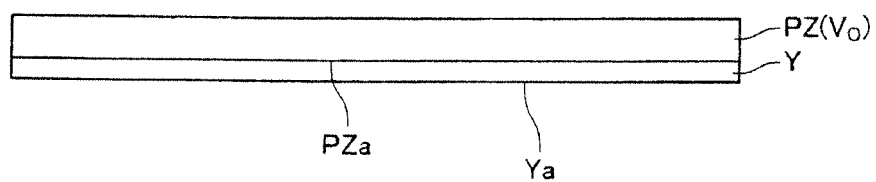
Figure 1C:
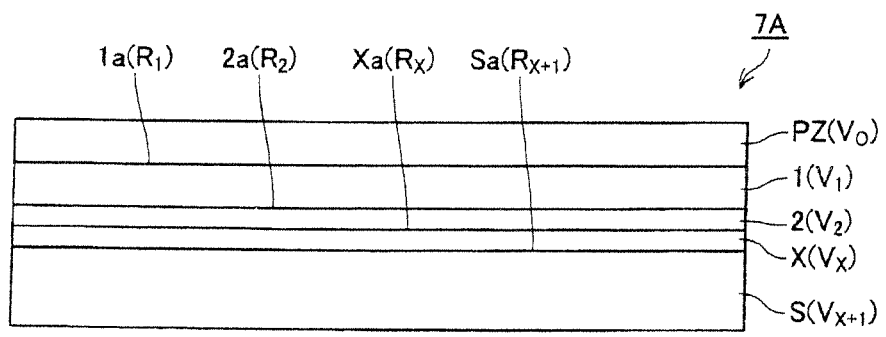

Further, as shown in FIG. 1(b), a bonding layer Y is provided on a main surface PZa of a piezoelectric material substrate PZ. The surface Ya of the bonding layer Y is subjected to surface activation. Then, surface Ma of the bonding layer M and surface Ya of the bonding layer Y are contacted and directly bonded with each other, so that a bonded body 7A can be obtained as shown in FIG. 1(c). In the case that the bonding layer Y and bonding layer M are made of substantially same material, both are substantially integrated to provide an intermediate layer 1.

Further, FIG. 2 shows the inventive example in which four layers of intermediate layers are provided between a piezoelectric material layer and supporting substrate.

Figure 2A:
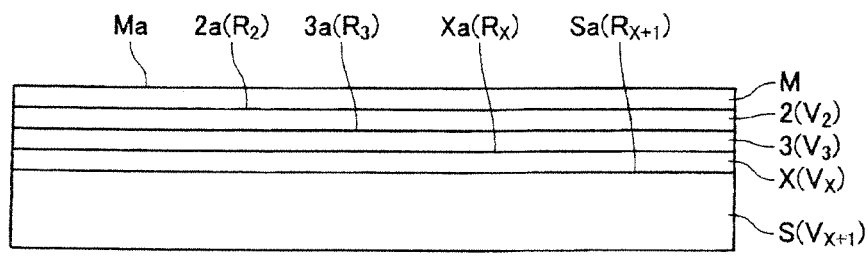

First, as shown in FIG. 2(a), intermediate layers X, 3 and 2 and bonding layer M are sequentially formed on the surface Sa of the supporting substrate S. Then, the surface Ma of the bonding layer M as the uppermost layer is subjected to precise polishing, for example to chemical mechanical polishing. Then, the surface Ma of the bonding layer M is subjected to surface activation.

Figure 2B:
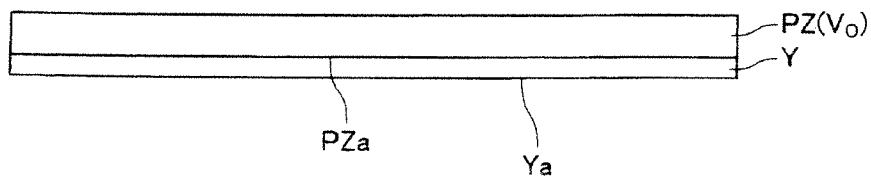

Further, as shown in FIG. 2(b), the surface PZa of the piezoelectric material substrate PZ is subjected to roughening process. The bonding layer Y is provided on the main surface PZa of the piezoelectric material substrate PZ. The surface Ya of the bonding layer Y is subjected to surface activation. Then, the surface Ma of the bonding layer M and surface Ya of the bonding layer Y are contacted and directly bonded with each other, so that a bonded body 7B shown in FIG. 2(c) can be obtained.

Figure 3A:
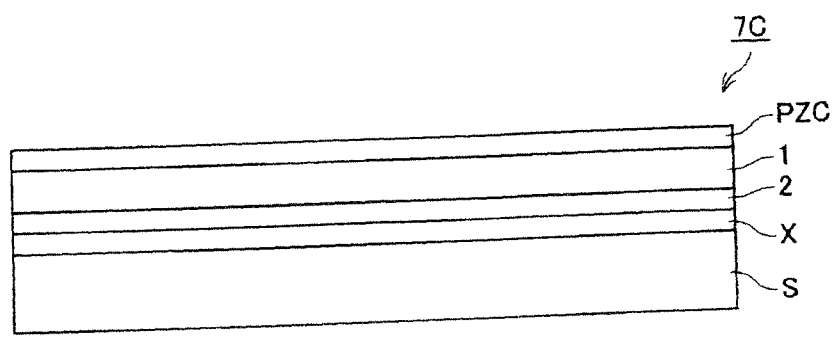
FIG. 3(a) shows the state that the piezoelectric material substrate of the bonded body is thinned by processing.
Figure 3B:
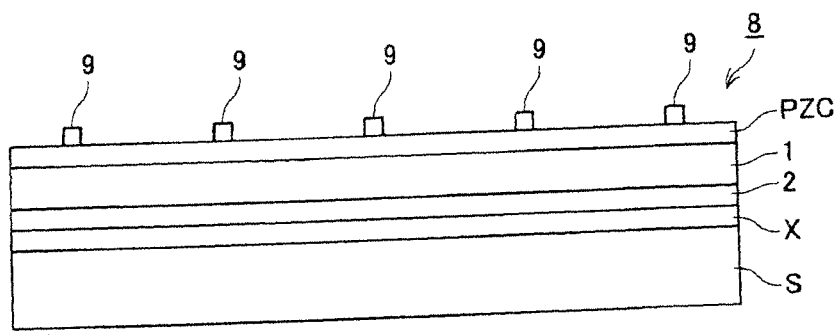
FIG. 3(b) shows an acoustic wave device 8.

Then, as shown in FIG. 3(a), the piezoelectric material substrate PZ is thinned by the processing to form the piezoelectric material substrate PZC so that a bonded body 7C is obtained. At this stage, electrodes may be provided on the piezoelectric material substrate PZC. However, preferably, as shown in FIG. 3(b), predetermined electrodes 9 are formed on the processed surface of the piezoelectric material substrate PZC so that an acoustic wave device 8 can be obtained.

Here, the respective arithmetic average roughnesses Ra and respective acoustic velocities of a plurality of intermediate layers between the piezoelectric material layer and supporting substrate are adjusted, so that it is possible to improve the bonding strength of the supporting substrate and piezoelectric material substrate and to suppress the spurious wave. Such construction will be further described.

First, x (x is 3 or larger) layers of intermediate layers are provided between the piezoelectric material layer PZ (PZC) and the surface Sa of the supporting substrate S. 3 layers or more of the intermediate layers are necessary, for reducing the arithmetic average roughnesses of the intermediate layers stepwise to effectively reduce the reflection of the bulk wave and to suppress the spurious. On the viewpoint, the number of the intermediate layers may more preferably be 4 or larger. Further, although the upper limit of the number of the intermediate layers is not particularly defined, the production cost is increased as the number of the intermediate layers is increased. On the viewpoint, the number of the intermediate layers may preferably be 10 or smaller.

The bonded body satisfies the formula (1), and satisfies the following formula (2) in the case that x is an even number and satisfies the following formula (3) in the case that x is an odd number.

First, the formula (1) defines the arithmetic average roughnesses of the supporting substrate and respective intermediate layers.

$$R_n < R_{n+1} \tag{1}$$

(In the formula (1), n represents all of integers from 1 to x, $R_n$ represents the arithmetic surface roughness of the surface of the n'th-order intermediate layer, on the side of the piezoelectric material substrate, from the piezoelectric material substrate, and $R_{x+1}$ represents the arithmetic average roughness of the surface, on the side of the piezoelectric material substrate, of the supporting substrate.)

That is, the arithmetic average roughness $R_1$ of the surface 1a on the side of the piezoelectric material substrate of the first-order intermediate layer 1 from the piezoelectric material substrate PZ on the side of the piezoelectric material substrate is lower than the arithmetic average roughness $R_2$ of the surface 2a of the second-order intermediate layer 2 on the side of the piezoelectric material substrate, and the arithmetic average roughness R2 of the surface 2a of the second-order intermediate layer 2 from the piezoelectric material substrate PZ on the side of the piezoelectric material substrate is lower than the arithmetic average roughness $R_3$ of the surface 3a, on the side of the piezoelectric material substrate, of the third-order intermediate layer 3. The arithmetic average roughnesses of the surfaces, on the side of the piezoelectric material substrate, of the intermediate layers are made higher in the order toward the supporting substrate. Then, the arithmetic average roughness of $R_{x+1}$ of the surface Sa, on the side of the piezoelectric material substrate, of the supporting substrate S is higher than the arithmetic average roughness Rx of the surface Xa, on the side of the piezoelectric material substrate, of the intermediate layer X nearest to the supporting substrate.

That is, the arithmetic average roughnesses of the respective surfaces, on the side of the piezoelectric material substrate, of the respective intermediate layers are made lower in the order, from the supporting substrate to the piezoelectric material substrate.

For example, according to the example of FIG. 1(c), three layers of the intermediate layers 1, 2 and X (x=3) are present between the piezoelectric layer PZ and supporting substrate S. In this case, the arithmetic average roughness $R_1$ of the surface 1a, on the side of the piezoelectric material substrate, of the first-order intermediate layer 1 from the piezoelectric material substrate PZ is lower than the arithmetic average roughness $R_2$ of the surface 2a, on the side of the piezoelectric material substrate, of the second-order intermediate layer 2, the arithmetic average roughness $R_2$ of the surface 2a of the second-order intermediate layer 2 is lower than the arithmetic average roughness Rx of the surface Xa of the third-order intermediate layer X (x'th layer order), and the arithmetic average roughness Rx of the surface Xa of the third-order intermediate layer X is lower than the arithmetic average roughness Rx+1 if the surface Sa of the supporting substrate S. That is, as it is more distant from the piezoelectric material layer, the arithmetic average roughnesses of the surfaces of the intermediate layers are increased stepwise.

Figure 2C:
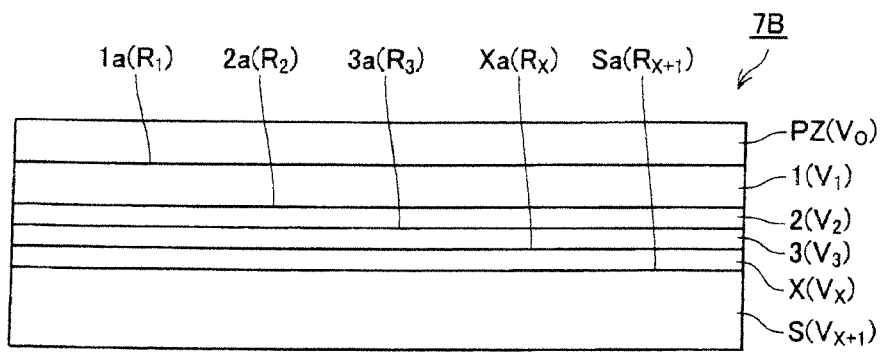

Further, according to the example of FIG. 2(c), four layers of the intermediate layers 1, 2, 3 and X (x=4) are present between the piezoelectric material layer PZ and supporting substrate S. In this case, the arithmetic average roughness $R_1$ of the surface 1a, on the side of the piezoelectric material substrate, of the first-order intermediate layer 1 from the piezoelectric material substrate PZ is lower than the arithmetic average roughness $R_2$ of the surface a, on the side of the piezoelectric material substrate, of the second-order intermediate layer 2, the arithmetic average roughness $R_2$ of the surface 2a of the second-order intermediate layer 2 is lower than the arithmetic average roughness $R_3$ of the surface 3a of the third-order intermediate layer 3, the arithmetic average roughness $R_3$ of the surface 3a of the third-order intermediate layer 3 is lower than the arithmetic average roughness Rx of the surface Xa of the fourth-order intermediate layer X (x'th layer), and the arithmetic average roughness Rx of the surface Xa of the fourth-order intermediate layer X is lower than the arithmetic average roughness Rx+1 of the surface Sa of the supporting substrate S. That is, as it is more distant from the piezoelectric material layer, the arithmetic average roughnesses of the surface of the intermediate layer are increased stepwise.

It is possible to improve the bonding strength with the piezoelectric material substrate by that the roughness of the intermediate layer is increased as it is more distant from the piezoelectric material substrate.

On such viewpoint, the difference between $R_{x+1}$ and $R_x$ may preferably be 0.2 nm or larger and more preferably be 0.5 nm or larger. Further, on a practical viewpoint, the difference between $R_{x+1}$ and $R_x$ may be 1 nm or smaller in many cases. Further, on the viewpoint of the present invention, the difference of $R_{n-1}$ and $R_n$ may preferably be 0.2 nm or larger and more preferably be 0.5 nm or larger. Further, on a practical viewpoint, the difference of $R_{n-1}$ and $R_n$ may preferably be 1 nm or smaller in many cases.

Further, the arithmetic average roughness Rx+1 of the supporting substrate S may preferably be 0.5 to 5 nm and more preferably be 1.5 to 4.0 nm. Further, on the viewpoint of the bonding strength, the arithmetic average roughness $R_1$ of the surface 1a of the intermediate layer 1 of the first-order) closest to the piezoelectric material layer may preferably be 1 nm or lower and more preferably be 0.3 nm or lower.

Further, it is required for the inventive bonded body that the acoustic velocities of the respective layers satisfy the predetermined relationship. That is, the following formula (2) is satisfied in the case x is an even number, and the following formula (3) is satisfied in the case that x is an odd number.

$$V_{n-1} < V_n \qquad (2)$$

(In the formula (2), n represents all of even numbers of x or lower, and $V_n$ represents the acoustic velocity of the n'th-order intermediate layer from the piezoelectric material layer.)

$$V_{n-1} > V_n \qquad (3)$$

(In the formula (3), n represents all of odd numbers of 1 or higher and x or lower, $V_n$ represents the acoustic velocity of the n'th-order intermediate layer from the piezoelectric material substrate, and $V_0$ represents the acoustic velocity of the piezoelectric material layer.)

For example, according to the example of FIG. 1(c), three layers of intermediate layers 1, 2 and X are formed between the piezoelectric material substrate and supporting substrate. As x is 3, the formula (3) is satisfied.

Figure 4:
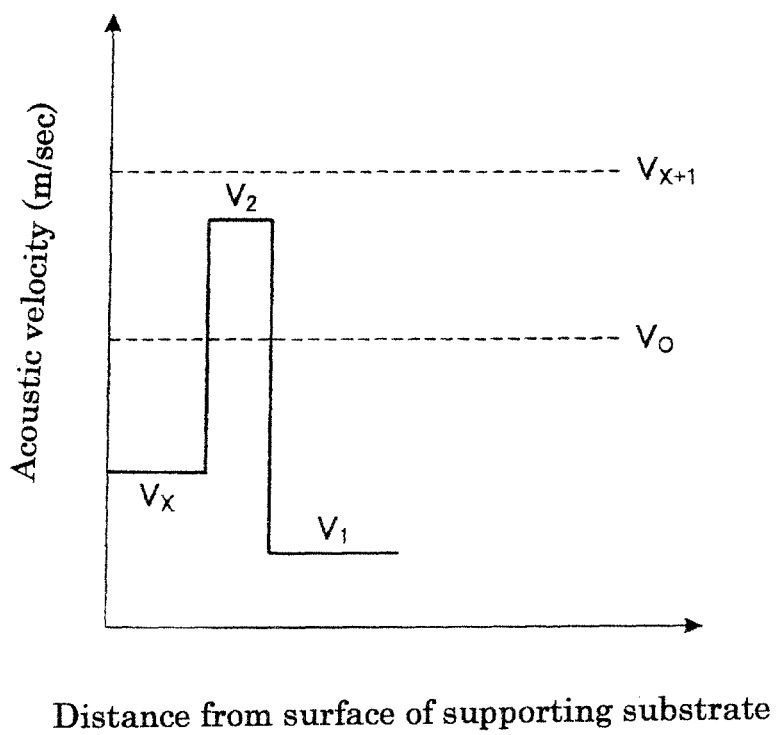
FIG. 4 is a graph showing an example of the acoustic velocities of intermediate layers on the supporting substrate.

Thus, the formula (3) is shown as FIG. 4, for example. Further, $V_{x+1}$ represents the acoustic velocity of the supporting substrate S.

Generally, in the case that x is an odd number, n is an odd number of 1 or higher and x or lower. It is thus arranged as follows from the supporting substrate to the piezoelectric material layer.

$$V_{x-1} > V_x; V_{x-3} > V_{x-2} \ldots V_2 > V_3; V_0 > V_1$$

In this case, although the large and small relationship of $V_{n-1}$ and $V_{n-2}$ is not limited, it is particularly preferred that the relationship of $V_{n-2} < V_{n-1}$ is satisfied.

In the case that x is an even number, $V_{n-1} < V_n \ldots$ (2) is satisfied. The acoustic velocities of the respective intermediate layers are as follows from the piezoelectric material layer to the supporting substrate.

$$V_{x-1} > V_x; V_{x-3} > V_{x-2} \ldots V_2 > V_3; V_0 > V_1$$

For example, according to the example of FIG. 2(c), four layers of the intermediate layers 1, 2, 3 and X are formed between the piezoelectric material layer and supporting substrate. As x is 4, the formula (2) is as follows.

$$V_3 < V_x; V_1 < V_2$$

Figure 5:
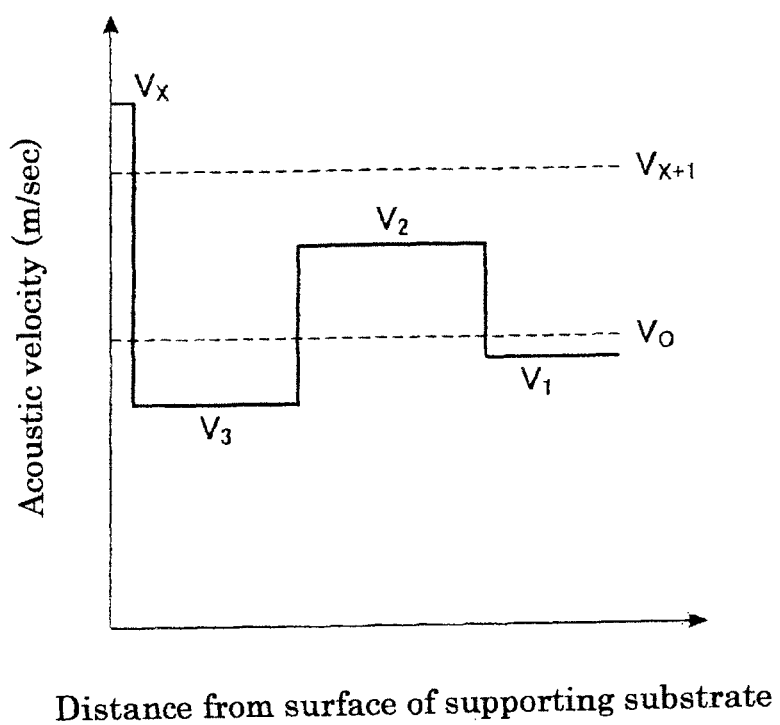
FIG. 5 is a graph showing an example of acoustic velocities of the intermediate layers on the supporting substrate.

Thus, for example, FIG. 5 applies. Further, $V_{x+1}$ represents the acoustic velocity of the supporting substrate S.

In this case, although the large and small relationship of $V_{n-1}$ and $V_{n-2}$ is not limited, it is preferred that the relationship of $V_{n-2} > V_{n-1}$ is satisfied.

On the viewpoint of the present invention, the difference of $V_{n-1}$ and $V_n$ may preferably be 200 m/sec or larger and more preferably be 500 m/sec or larger, in both of the formulas (2) and (3). Further, on a practical viewpoint, the difference of $V_{n-1}$ and $V_n$ may be 3000 m/sec or smaller in both of the formulas (2) and (3) in many cases.

On the viewpoint of the present invention, the difference of $V_0$ and $V_1$ may preferably be 200 m/sec or larger and more preferably be 500 m/sec or larger. Further, although the difference of $V_0$ and $V_1$ is not particularly limited, it may be 3000 m/sec or smaller on a practical viewpoint.

Further, in the case that $V_{n-2}$ and $V_{n-1}$ are different, the difference of $V_{n-2}$ and $V_{n-1}$ may preferably be 1000 m/sec or larger and more preferably be 3000 m/sec or larger.

Further, on a practical viewpoint, the difference of $V_{n-2}$ and $V_{n-1}$ may be 10000 m/sec or smaller in many cases.

Although the material of the supporting substrate is not particularly limited, it may preferably be a material selected from the group consisting of silicon, quartz and sapphire. It is thereby possible to further improve the temperature characteristics of frequency of the acoustic weave device.

Further, the surface of the supporting substrate on the side of the piezoelectric material layer may be roughened by the processing with grinding stones or blasting process.

Further, the blasting process means a process of spraying an grinding agent with compressed air on the surface.

Although the method of film-forming the respective intermediate layers and the intermediate layers on the piezoelectric material substrate is not limited, sputtering, chemical vapor deposition method (CVD) and vapor deposition may be listed.

Although the materials of the respective intermediate layers are not particularly limited as far as the surface activation process is possible, a metal oxide is preferred and a material selected from the group consisting of silicon, silicon oxide, alumina, tantalum pentoxide, niobium pentoxide, and titanium oxide is particularly preferred. Further, as the method of the surface activation process, it may be appropriately selected depending on the applied material of the bonding layer. Such surface activation method may be plasma activation method and FAB (Ar atomic beam) method.

The thicknesses of the respective intermediate layers may preferably be 0.02 μm or larger, more preferably be 0.05 μm or larger and most preferably be 0.1 μm or larger, on the viewpoint of the present invention. Further, the thicknesses of the respective intermediate layers may preferably be 3 μm or smaller, more preferably be 2 μm or smaller and most preferably be 1 μm or smaller.

Further, the total thickness of a plurality of the intermediate layers may preferably be 0.1 to 5 μm and more preferably be 0.2 to 2 μm, on the viewpoint of the present invention.

The piezoelectric material substrate applied in the present invention may preferably be composed of lithium tantalate (LT) single crystal, lithium niobate (LN) single crystal or lithium niobate-lithium tantalate solid solution. As these materials have higher propagation speeds of an acoustic wave and large electro-chemical coupling constants, the materials are suitable for an acoustic surface wave device for high frequency and wide-band frequency applications.

Further, although the direction of the normal line of the main surface of the piezoelectric material substrate is not particularly limited, in the case that the piezoelectric material substrate is composed of LT, for example, it is preferred to use the substrate rotated from Y-axis to Z-axis by 32 to 55° (180°, 58 to 35°, 180° on Euler angle representation) around X-axis, which is a direction of propagation of a surface acoustic wave, because of a low propagation loss. In the case that the piezoelectric material substrate is composed of LN, it is preferred to use (i) the substrate rotated from Z-axis to −Y-axis by 37.8° (0°, 37.8°, 0° on Euler angle representation) around X-axis, which is a direction of propagation of a surface acoustic wave, because of a large electro-mechanical coupling coefficient. Alternatively, it is preferred to use (ii) the substrate rotated from Y-axis to Z-axis by 40 to 65° (180°, 50 to 25°, 180° on Euler angle representation) around X-axis, which is a direction of propagation of a surface acoustic wave, because of a large acoustic velocity. Further, although the size of the piezoelectric material substrate is not particularly limited, for example, the diameter may be 100 to 200 mm and thickness may be 0.15 to 1 μm.

For example, the surface of the bonding layer M on the upper most surface on the supporting substrate and the surface PZa of the piezoelectric material substrate PZ on the side of the supporting substrate or the surface Ya of the bonding layer Y on the piezoelectric material substrate are subjected to surface activation to perform the direct bonding. For example, plasma is irradiated onto the respective surfaces at 150° C. or lower to activate the bonding surfaces. On the viewpoint of the present invention, it is preferred to irradiate nitrogen plasma, and it is possible to obtain the bonded body of the present invention even in the case that oxygen plasma is irradiated.

The pressure during the surface activation may preferably be 100 Pa or lower and more preferably be 80 Pa or lower. Further, the atmosphere may be of nitrogen only, or oxygen only, or a mixture of nitrogen and oxygen.

The temperature during the plasma irradiation may preferably be 150° C. or lower. It is thereby possible to obtain a bonded body having a high bonding strength and with no deterioration of crystallinity. On the viewpoint, the temperature during the plasma irradiation is made 150° C. or lower and may preferably be 100° C. or lower.

Further, the energy during the plasma irradiation may preferably be 30 to 150 W. Further, the product of the energy during the plasma irradiation and time for the irradiation may preferably be 0.12 to 1.0 Wh.

The bonding surface of the piezoelectric material substrate after the plasma treatment and bonding surface of the bonding layer are then contacted with each other at room temperature. At this time, the treatment may be performed under vacuum and the surfaces may be contacted in atmosphere.

When the activation of the surfaces is performed by argon atomic beam, it is preferred to use a system described in Japanese Patent Publication No. 2014-086400A to generate the argon atomic beam, which is irradiated. That is, it is used a high-speed atomic beam source of saddle field type as the beam source. Then, inert gas is introduced into the chamber and a high voltage is applied onto electrodes from a direct current electric source. By this, electric field of saddle field type generated between the electrode (positive electrode) and a housing (negative electrode) causes motion of electrons, e, so that argon atomic and ion beams are generated. Among the beams reached at a grid, the ion beam is neutralized at the grid, and the beam of argon atoms is emitted from the high-speed atomic beam source. In the activation step by beam irradiation, the voltage may preferably be made 0.5 to 2.0 kV, and the current may preferably be made 50 to 200 mA.

The surface Ma of the bonding layer M at the uppermost surface on the supporting substrate and the surface PZa of the piezoelectric material substrate PZ or the surface Ya of the bonding layer Y on the piezoelectric material substrate are then contacted and bonded with each other. Thereafter, it is preferred to perform annealing treatment to improve the bonding strength. The temperature during the annealing treatment may preferably be 100° C. or higher and 300° C. or lower.

The bonded body of the present invention may preferably be applied to an acoustic wave device. That is, the acoustic wave device includes the inventive bonded body and an electrode provided on the piezoelectric material substrate.

Specifically, as the acoustic wave device, a surface acoustic wave device, Lamb wave-type device, thin film resonator (FBAR) or the like is known. For example, the surface acoustic wave device is produced by providing input side IDT (Interdigital transducer) electrodes (also referred to as comb electrodes or interdigitated electrodes) for oscillating surface acoustic wave and IDT electrodes on the output side for receiving the surface acoustic wave on the surface of the piezoelectric material substrate. By applying high frequency signal on the IDT electrodes on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

The material forming the electrode on the piezoelectric material substrate may preferably be aluminum, an aluminum alloy, copper or gold, and more preferably be aluminum or the aluminum alloy. As the aluminum alloy, it is preferred to use Al mixed with 0.3 to 5 weight % of Cu therein. In this case, Ti, Mg, Ni, Mo or Ta may be used instead of Cu.

EXAMPLES

Inventive Example 1

It was produced an acoustic wave device 8 shown in FIG. 3(b), according to the procedure described referring to FIGS. 1 and 3.

Specifically, it was prepared a 42Y-cut X-propagation LiTaO$_3$ substrate (piezoelectric material substrate) PZ having a thickness of 350 μm and whose both surfaces were subjected to mirror polishing. Further, it was prepared a high-resistance (>2kΩ·cm) (100) substrate (supporting substrate) S having a thickness of 675 μm. The sizes of both substrates were 150 mm.

Then, the surface Sa of the supporting substrate S was subjected to grinding process with grinding stones corresponding with GC #6000. The size of the processing was made 5 μm so that the whole surface was uniformly processed. As the surface Sa of the supporting substrate after the processing was measured by means of an apparatus of measuring roughness of optical interference system, the arithmetic average surface roughness $R_{x+1}$ was proved to be 3.2 nm.

After the surface Sa of the supporting substrate S was cleaned, an intermediate layer X composed of Ta$_2$O$_5$ was film-formed by means of a sputtering system. The thickness of the intermediate layer X at this stage was proved to be 1200 nm. As a wafer after the film-formation was taken out and the arithmetic average roughness $R_x$ of the surface Xa was measured, it was considerably lowered to 1.9 nm. An intermediate layer 2 of silicon was continuously film-formed in 800 nm on the intermediate layer X. The arithmetic average roughness $R_2$ of the surface 2a of the intermediate layer 2 was 1.3 nm. Further, a bonding layer M composed of silicon oxide was film-formed in a thickness of 400 nm, so that a laminated structure of the three layers was finally provided. The arithmetic average roughness of the surface Ma of the bonding layer M was 1.0 nm, providing a surface considerably smoother than the initial 3.2 nm. The surface of the bonding layer at the uppermost surface was subjected to CMP process for performing the removal of about 30 nm. As a result, the arithmetic average roughness of the surface could be made 0.6 nm.

Further, a bonding layer Y composed of silicon oxide was film-formed in a thickness of 100 nm on the surface PZa of the piezoelectric material substrate PZ. The arithmetic average roughness of the surface Ya of the bonding layer Y at this stage was 1.2 nm. The surface was processed by CMP in about 50 nm to provide an arithmetic average roughness of 0.3 nm.

The bonding surface of the bonding layer on the thus obtained piezoelectric material substrate and the surface of the bonding layer at the uppermost surface on the supporting substrate were subjected to cleaning and surface activation, respectively. Specifically, ultrasonic cleaning was performed by pure water and the surfaces of the substrates were dried by spin drying. Then, the supporting substrate after the cleaning was supplied into a plasma activation chamber and the bonding surface was activated by nitrogen gas plasma at 30° C. Further, the piezoelectric material substrate was similarly supplied into the plasma activation chamber and the bonding surface was subjected to surface activation by nitrogen gas plasma at 30° C. The time of the surface activation was made 40 seconds, and the energy was made 100 W. For removing particles adhered during the surface activation, the ultrasonic cleaning and spin drying as described above were performed again.

Then, the positioning of the respective substrates was performed and the activated bonding surfaces of both substrates were contacted with each other at room temperature. They were contacted with the piezoelectric material substrate side positioned upwardly. As a result, it was observed the state (so-called bonding wave) in which the adhesion of the substrates was spreading, proving that good preliminary bonding was accomplished. Then, for improving the bonding strength, the bonded body was charged into an oven filled with nitrogen atmosphere, and held at 150° C. for 10 hours. The bonding strength of the bonded body taken out from the oven was measured by crack opening method to prove that a sufficiently high bonding strength of 2.3 J/m$^2$ was obtained.

The surface of the piezoelectric material substrate of the bonded body after the heating was subjected to grinding process, lapping process and CMP process until the thickness of the piezoelectric material substrate was made 20 μm.

Then, for confirming the effect of the present invention, a comb electrode composed of aluminum metal was formed on the piezoelectric material substrate of the bonded body to produce a resonator of a surface acoustic wave device. The specification was as follows.

Figure 6:
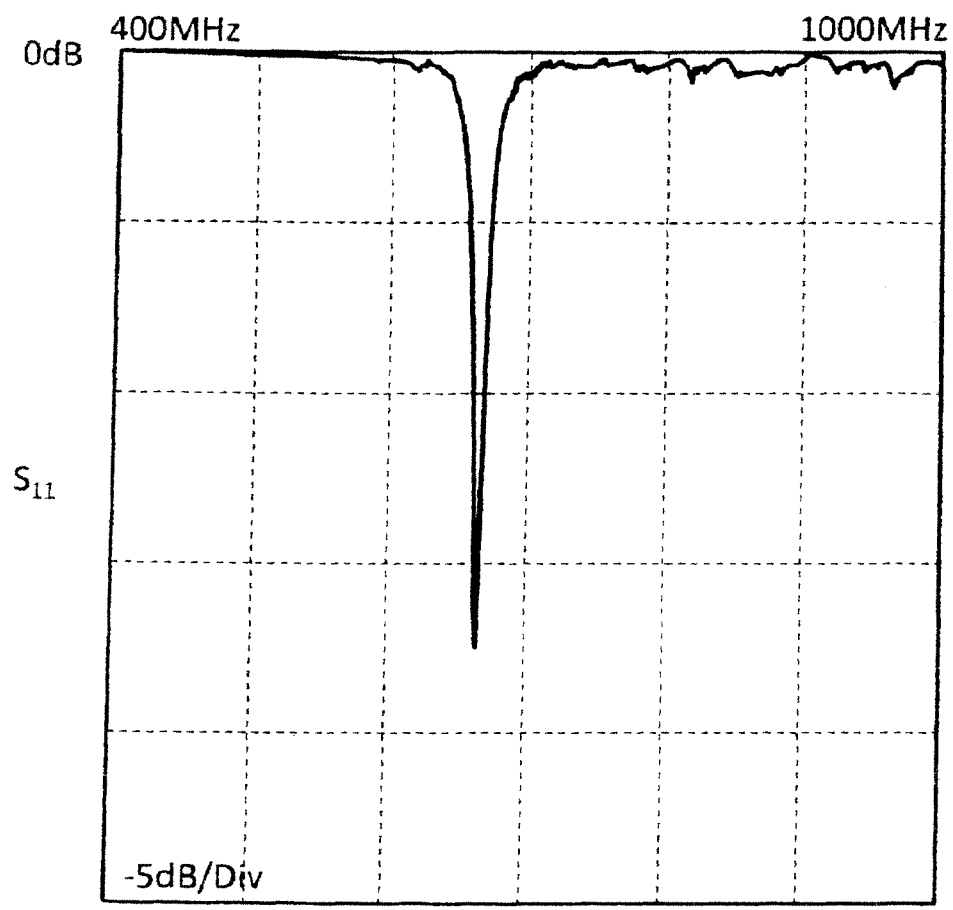
FIG. 6 is a graph showing frequency characteristics of $S_{11}$ of the acoustic wave device of the inventive example.

IDT period: 6 μm
IDT aperture length: 300 um
Number of IDT lines: 80 lines
Number of lines of reflector: 40 lines As the reflection characteristics was measured by means of a network analyzer, the magnitude of the maximum spurious, in a region whose frequency is higher than an anti-resonance frequency, was 2.2 dB as shown in FIG. 6.

The respective physical properties of the supporting substrate, intermediate layers and piezoelectric material substrate in the inventive examples were summarized and shown below. Further, the acoustic velocities of the respective parts were shown in FIG. 4.

|  | Arithmetic average: roughness of surface (nm) | Acoustic velocity: (m/sec) |
|---|---|---|
| Piezoelectric material Layer PZC | — | 5,574 |
| First-order intermediate layer 1 | 1.0 | 4,173 |
| Second-order intermediate layer 2 | 1.3 | 7,458 |

-continued

|  | Arithmetic average: roughness of surface (nm) | Acoustic velocity: (m/sec) |
|---|---|---|
| Third-order intermediate layer X | 1.9 | 5,235 |
| Supporting substrate | 3.2 | — |

Further, the acoustic velocities of the respective parts were defined as follows.

That is, provided that the elastic modulus and density of a material are represented as E and ρ, respectively, the acoustic velocity is calculated according to the following formula.

$$V = \sqrt{\frac{E}{\rho}}$$

Although various reports have been made for the parameters in the case of piezoelectric crystals (for example, it is described in detail in "Acoustic wave device technology", edited by Japan society for the promotion of science, Acoustic wave device technology $150^{Th}$ committee), the measurement is necessary for each dielectric thin film. Each substance is film-formed on an Si substrate by sputtering method. The thickness at this time was made about 1 μm. First, the density of each film was measured by X-ray reflection method. Further, the elastic modulus is further measured by neo-indentation test, and the acoustic velocity of each film is calculated according to the formula described above.

Further, the arithmetic average roughness of each surface is calculated based on roughness data of the surface obtained by observing a region of 10×10 μm by means of an atomic force microscope (AFM) supplied by HITACHI HI TECH Co. Ltd.

Inventive Example 2

The bonded body 7B shown in FIG. 2(c) was produced as the inventive example 1, and further subjected to the treatment shown in FIG. 3 to obtain an SAW device.

Further, the intermediate layers X, 3, 2 and bonding layer M were provided on the supporting substrate. Specifically, after the surface Sa of the supporting substrate S made of silicon and having an arithmetic average roughness Ra of 3.2 nm was cleaned, the intermediate layer X of aluminum oxide was film-formed by a sputtering system. The thickness of the intermediate layer X at this stage was 600 nm. As the wafer after the film-formation was once taken out and the arithmetic average roughness $R_x$ of the surface Xa of the intermediate layer X was measured, it was lowered to 2.7 nm. The intermediate layer 3 composed of silicon oxide was continuously film-formed on the same wafer again in 1000 nm. The arithmetic average roughness at this stage was 1.6 nm. After the intermediate layer 2 composed of silicon was further film-formed in a thickness of 300 nm, the bonding layer M composed of silicon oxide was continuously film-formed in 350 nm, so that the supporting substrate having the film structure of the 4 layers was finally obtained. The arithmetic average roughnesses of the intermediate layer 2 and bonding layer M at this stage were 1.3 nm and 1.2 nm, respectively, providing the surfaces which were considerably smoother than that of the initial 3.2 nm. The surface Ma of the bonding layer M at the uppermost surface was subjected to CMP process to remove about 30 nm. As a result, the arithmetic average roughness of the surface Ma of the bonding layer M could be made 0.55 nm.

The SAW device as shown in FIG. 3(b) was produced according to the same procedure as that of the inventive example 1, and the similar measurement was performed. It was thus proved that the magnitude of the maximum spurious was 1.3 dB.

The surface roughnesses and acoustic velocities of the respective layers were as follows. Further, the acoustic velocities of the respective parts were shown in FIG. 5.

|  | Arithmetic average Roughness of surface (nm) | Acoustic velocity (m/sec) |
|---|---|---|
| Piezoelectric material layer PZC | — | 5,574 |
| First-order intermediate layer 1 | 1.2 | 5,235 |
| Second-order intermediate layer 2 | 1.3 | 6,872 |
| Third-order intermediate Layer 3 | 1.6 | 5,235 |
| Fourth-order intermediate Layer X | 2.7 | 7,458 |
| Supporting substrate S | 3.2 | — |

Comparative Example 1

The bonded body shown in FIG. 1 was produced according to the same procedure as that of the inventive example 1, and then subjected to the treatment shown in FIG. 3 to obtain an SAW device.

However, according to the present example, the materials of the respective intermediate layers were changed in the inventive example 1. Specifically, on the surface Sa of the supporting substrate S composed of silicon and having an arithmetic average roughness Ra of 2.8 nm, the intermediate layer X (600 nm) composed of aluminum oxide, intermediate layer 2 (1200 nm) composed of silicon oxide and bonding layer M (400 nm) at the uppermost surface composed of silicon were sequentially film-formed, to obtain the three-layered structure. The respective average roughnesses of the respective intermediate layers 2 and bonding layer M were 1.2 nm, 1.0 nm and 0.9 nm, respectively. The bonding layer at the uppermost surface was subjected to CMP polishing in about 20 nm to provide a mirror surface. After Ar neutral atoms were then irradiated onto the surface of the bonding layer on the piezoelectric material substrate and surface of the intermediate layer at the uppermost surface on the supporting substrate, the surfaces were subjected to direct bonding.

Figure 7:
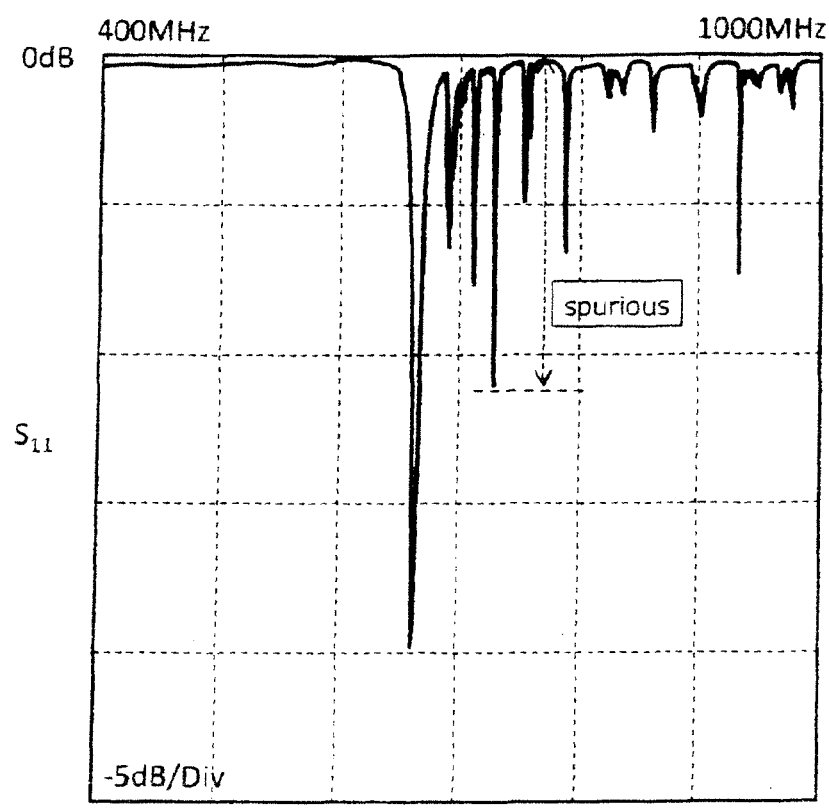
FIG. 7 is a graph showing frequency characteristics of $S_{11}$ of the acoustic wave device of the comparative example.

After the piezoelectric material substrate was processed to a thickness of 20 μm according to the same procedure as that of the inventive example 1, the frequency characteristics was measured to obtain a chart of frequency change of $S_{11}$ as shown in FIG. 7. Further, the magnitude of the maximum spurious was 14.4 dB.

The surface roughnesses and acoustic velocities of the respective layers were as follow.

|  | Arithmetic average Roughness of surface (nm) | Acoustic velocity (m/sec) |
|---|---|---|
| Piezoelectric material layer PZC | — | 5,574 |
| First-order intermediate layer 1 | 0.9 | 6,872 |
| Second-order intermediate layer 2 | 1.0 | 5,235 |

-continued

| | Arithmetic average Roughness of surface (nm) | Acoustic velocity (m/sec) |
|---|---|---|
| Third-order intermediate layer X | 1.2 | 7,458 |
| Supporting substrate S | 2.8 | — |

Comparative Example 2

The bonded body as shown in FIG. 1 was produced according to the same procedure as that of the inventive example 1 and then subjected to the treatment shown in FIG. 3 to obtain an SAW device.

However, according to the present example, the materials of the respective intermediate layers were changed in the inventive example 1. Specifically, on the surface Sa of the supporting substrate S composed of silicon and having an arithmetic average roughness Ra of 2.9 nm, the intermediate layer (600 nm) composed of silicon, intermediate layer 2 (1200 nm) composed of aluminum oxide and bonding layer M (400 nm) at the uppermost surface composed of silicon were sequentially film-formed. The respective arithmetic average roughnesses of the respective intermediate layers 2 and bonding layer M at the time of the film-formation were 2.2 nm, 1.7 nm and 1.6 nm, respectively. The bonding layer at the uppermost surface was subjected to CMP polishing in about 80 nm to form a mirror surface. After Ar neutral atoms were irradiated onto the surface of the piezoelectric material substrate and surface of the bonding layer at the uppermost surface on the supporting substrate, the surfaces were directly bonded.

As the frequency characteristics were measured after the thickness of the piezoelectric material substrate was processed to 20 μm as the inventive example 1, the magnitude of the maximum spurious was proved to be 17.8 dB.

The surface roughnesses and acoustic velocities of the respective layers were as follows.

| | Arithmetic average Roughness of surface (nm) | Acoustic velocity (m/sec) |
|---|---|---|
| Piezoelectric material layer PZC | — | 5,574 |
| First-order intermediate layer 1 | 1.6 | 6,872 |
| Second-order intermediate layer 2 | 1.7 | 7,458 |
| Third-order intermediate layer X | 2.2 | 6,872 |
| Supporting substrate S | 2.9 | — |

The invention claimed is:

1. A composite substrate for an acoustic wave device, said composite substrate comprising:
    a piezoelectric material layer;
    a supporting substrate; and
    x layers (x represents an integer of 3 or larger) of intermediate layers between said piezoelectric material layer and said supporting substrate,
    wherein said piezoelectric material layer, said supporting substrate and said intermediate layers satisfy the following formula (1),
    wherein the following formula (2) is satisfied when x is an even number, and
    wherein the following formula (3) is satisfied when x is an odd number, $$R_n < R_{n+1} \tag{1}$$

(In the formula (1),
    n represents all of integers of 1 to x,
    $R_n$ represents an arithmetic average roughness of a surface, on a side of said piezoelectric material layer, of an n'th-order intermediate layer from said piezoelectric material layer, and
    $R_{x+1}$ represents an arithmetic average roughness of a surface, on a side of said piezoelectric material layer, of said supporting substrate,)

$$V_{n-1} < V_n \tag{2}$$

(In the formula (2),
    n represents all of even numbers of 2 or larger and x or smaller, and
    $V_n$ represents an acoustic velocity of said n'th-order intermediate layer from said piezoelectric material layer,)

$$V_{n-1} > V_n \tag{3}$$

(In the formula (3),
    n represents all of odd numbers of 1 or larger and x or smaller,
    $V_n$ represents said acoustic velocity of said n'th-order intermediate layer from said piezoelectric material layer, and
    $V_0$ represents an acoustic velocity of said piezoelectric material layer.).

2. The composite substrate for an acoustic wave device of claim 1, wherein said intermediate layer comprises a material selected from the group consisting of silicon, silicon oxide, alumina, tantalum pentoxide, niobium pentoxide, hafnium oxide and titanium oxide.

3. The composite substrate for an acoustic wave device of claim 1, wherein said surface of said supporting substrate on the side of said piezoelectric material layer is roughened by processing by a grinding stone or blast processing.

* * * * *